US012794484B1

(12) United States Patent
Barkeshli et al.

(10) Patent No.: US 12,794,484 B1
(45) Date of Patent: Nov. 10, 2026

(54) ELECTROMAGNETIC INTERFERENCE CANCELLATION IN VEHICLE NETWORKS

(71) Applicant: Infineon Technologies Americas Corp., El Segundo, CA (US)

(72) Inventors: Sina Barkeshli, Saratoga, CA (US); Seid Alireza Razavi Majomard, Belmont, CA (US); Viswakiran Popuri, Milpitas, CA (US); Ragnar Hlynur Jonsson, Aliso Viejo, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 213 days.

(21) Appl. No.: 18/597,794

(22) Filed: Mar. 6, 2024

Related U.S. Application Data

(60) Provisional application No. 63/450,332, filed on Mar. 6, 2023.

(51) Int. Cl.
*H03M 1/10* (2006.01)
*H03M 1/06* (2006.01)
*H03M 1/08* (2006.01)

(52) U.S. Cl.
CPC ....... *H03M 1/0827* (2013.01); *H03M 1/0626* (2013.01); *H03M 1/1085* (2013.01)

(58) Field of Classification Search
CPC .... H03M 1/12; H03M 1/1215; H03M 1/1009; H03M 1/06; H03M 1/60; H03M 1/08; H03M 1/10; H03M 1/1042; H03M 1/1085; H03M 1/0614; H03M 1/0624; H03M 1/0626; H03M 1/0634; H03M 1/128; H03M 1/181; H03M 1/464; H03M 1/502; H03M 13/19; H03H 11/12; H03H 11/1291; H03H 2210/012; H03H 2210/015; H03H 2210/017; H03H 2210/021; H03H 2210/025; H03H 9/542; H03H 9/545; H03H 9/6403; H03H 9/6433; H04B 1/401; H04B 17/12; H04B 15/04; H04B 1/123; H04B 1/1036; H04B 1/1027

(Continued)

(56) References Cited

U.S. PATENT DOCUMENTS 4,549,312 A * 10/1985 Michaels ............. H04B 1/1036 455/295
5,777,692 A * 7/1998 Ghosh .................... H04N 7/102 348/E5.077

(Continued)

*Primary Examiner* — Linh V Nguyen

(57) ABSTRACT

A physical layer transceiver for a vehicular network includes receive path circuitry configured to, in an analog domain, receive an incoming signal from the vehicular network, where the incoming signal comprises an analog signal subject to electromagnetic interference (EMI) and convert the incoming signal into a digital signal. The transceiver also includes EMI detector circuitry configured to, in a digital domain, determine a primary frequency associated with the EMI, and EMI cancelling circuitry configured to derive, in the digital domain, a correction signal having a delay length based on the primary frequency determined in the digital domain and associated with the EMI, and add, in the analog domain, the correction signal derived in the digital domain to the incoming signal to reduce the EMI in the digital signal. In some implementations, the transceiver also includes a colored noise canceller filter to further reduce the EMI in the digital signal.

8 Claims, 3 Drawing Sheets

(58) Field of Classification Search
USPC .......................... 341/118–120, 140, 142, 155
See application file for complete search history.

(56) References Cited

U.S. PATENT DOCUMENTS

| | | | | |
|---|---|---|---|---|
| 5,995,567 | A * | 11/1999 | Cioffi | H04B 1/126 455/296 |
| 6,307,492 | B1 * | 10/2001 | Berranger | H03M 1/0641 341/131 |
| 7,324,618 | B2 * | 1/2008 | Oh | H04B 1/1036 455/278.1 |
| 8,243,864 | B2 * | 8/2012 | Ciccarelli | H03G 3/3052 455/306 |
| 8,625,704 | B1 * | 1/2014 | Sedarat | H04B 3/32 375/295 |
| 9,184,775 | B2 * | 11/2015 | Reinhardt | H04B 1/109 |
| 9,350,375 | B1 * | 5/2016 | Lin | H03M 1/1265 |
| 9,559,753 | B2 * | 1/2017 | McCormack | H04B 5/20 |
| 9,716,529 | B1 * | 7/2017 | Dai | H04L 25/03885 |
| 9,838,072 | B1 * | 12/2017 | Dai | H04L 25/03885 |
| 2024/0319326 | A1 * | 9/2024 | Shalita | G01S 7/295 |

* cited by examiner

ELECTROMAGNETIC INTERFERENCE CANCELLATION IN VEHICLE NETWORKS

CROSS REFERENCE TO RELATED APPLICATION

This disclosure claims the benefit of, commonly-assigned U.S. Provisional Patent Application No. 63/450,332, filed Mar. 6, 2023, which is hereby incorporated by reference herein in its entirety.

FIELD OF USE

This disclosure relates to electromagnetic interference (EMI) cancellation circuitry. More particularly, this disclosure relates to circuitry that uses properties of the EMI to reduce the effects of the EMI in vehicular communication systems.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Electronic signals, including those in the analog and digital domains, are typically subject to EMI. EMI can interfere with, or produce errors in, the transfer of electronic signals. EMI may be of particular concern in electronically noisy environments and/or environments in which signaling errors can impact operational integrity or safety, such as vehicular environments.

SUMMARY

In accordance with implementations of the subject matter of this disclosure, a physical layer transceiver for a vehicular network includes receive path circuitry configured to in an analog domain, receive an incoming signal from the vehicular network, where the incoming signal includes an analog signal subject to electromagnetic interference (EMI), and convert the incoming signal into a digital signal, EMI detector circuitry configured to, in a digital domain, determine a primary frequency associated with the EMI, and EMI cancelling circuitry configured to derive, in the digital domain, a correction signal having a delay length based on the primary frequency determined in the digital domain and associated with the EMI, and add, in the analog domain, the correction signal derived in the digital domain to the incoming signal to reduce the EMI in the digital signal.

In a first implementation of such a physical layer transceiver, the physical layer transceiver may also include slicer circuitry configured to, in the digital domain, determine a slicer error from the digital signal, where the EMI detector circuitry is configured to use the slicer error to determine the primary frequency associated with the EMI.

In a second implementation of such a physical layer transceiver, the EMI detector circuitry may be configured to, in the digital domain, determine the primary frequency associated with the EMI by calculating a Fast Fourier Transform.

In a first aspect of that second implementation, the EMI cancelling circuitry may include at least one impedance element, where the delay length is configured by activating the at least one impedance element.

In a first instance of that first aspect of that second implementation, the at least one impedance element may include multiple inductors and capacitors, where the delay is length is configured by activating inductors and capacitors among the multiple inductors and capacitors.

In a first approach to that first instance of that first aspect of that second implementation, the EMI cancelling circuitry may be configured to activate the inductors and capacitors among the multiple inductors and capacitors based on data of a look-up table, where the data are indicative of inductance and capacitance values to apply based on the primary frequency associated with the EMI.

In a third implementation of such a physical layer transceiver, the physical layer transceiver may also include a colored noise canceller (CNC) filter configured to, in the digital domain, after adding the correction signal to the incoming signal, further reduce the EMI in the digital signal by adding a second correction signal to the incoming signal, where the second correction signal includes an inverse sinusoid of the EMI.

In a first aspect of that third implementation, the physical layer transceiver may also include controller circuitry configured to adapt a center frequency of the CNC filter based on the primary frequency associated with the EMI, where the inverse sinusoid of the EMI is based on the center frequency.

In a first instance of that first aspect of that third implementation, the controller circuitry may be configured to adapt the center frequency of the CNC filter by adjusting a number of taps of the CNC filter.

In a fourth implementation of such a physical layer transceiver, the EMI detector circuitry may also be configured to determine an amplitude associated with the EMI, and the EMI cancelling circuitry may also be configured to set a gain of the correction signal, where the gain is based on the amplitude associated with the EMI.

In a first aspect of that fourth implementation, the EMI cancelling circuitry may include at least one impedance element and an amplifier, where the delay length and the gain may be respectively configured by activating an element among the at least one impedance element and by setting a gain of the amplifier based on the amplitude associated with the EMI.

In accordance with implementations of the subject matter of this disclosure, a method for reducing, from signals received over a physical layer transceiver in a vehicular network, electromagnetic interference (EMI) includes receiving, using receive path circuitry of the physical layer transceiver operating in an analog domain, an incoming signal from the vehicular network, where the incoming signal includes an analog signal subject to EMI, converting, using the receive path circuitry of the physical layer transceiver, the incoming signal into a digital signal, determining, using EMI detector circuitry operating in a digital domain, a primary frequency associated with the EMI, deriving, using EMI cancelling circuitry operating in the digital domain, a correction signal to have a delay length based on the primary frequency determined in the digital domain and associated with the EMI, and adding, using the EMI cancelling circuitry operating in the analog domain, the correction signal derived in the digital domain to the incoming signal to reduce the EMI in the digital signal.

A first implementation of such a method may also include determining, using slicer circuitry operating in the digital domain, a slicer error from the digital signal, where determining the primary frequency associated with the EMI is based on the slicer error.

In a second implementation of such a method, determining, using EMI detector circuitry operating in the digital domain, the primary frequency associated with the EMI may include calculating a Fast Fourier Transform.

In a first aspect of that second implementation, the method may also activating at least one impedance element of the EMI cancelling circuitry to configure the delay length.

In a first instance of that first aspect of that second implementation, the at least one impedance element may include multiple inductors and capacitors, where activating the at least one impedance element includes activating inductors and capacitors among the multiple inductors and capacitors.

In a first approach of that first instance of that first aspect of that second implementation, the method may also include accessing data of a look-up table, where the data are indicative of inductance and capacitance values to apply to inductors and capacitors among the multiple inductors and capacitors based on the primary frequency associated with the EMI.

A third implementation of such a method may also include, after adding the correction signal to the incoming signal, further reducing, using a colored noise canceller (CNC) filter operating in the digital domain, the EMI in the digital signal by adding a second correction signal to the incoming signal, the second correction signal including an inverse sinusoid of the EMI.

In a first aspect of that third implementation, the method may also include adapting, using controller circuitry, a center frequency of the CNC filter based on the primary frequency associated with the EMI, where the inverse sinusoid of the EMI is based on the center frequency.

In a first instance of that first aspect of that third implementation, adapting, using controller circuitry, the center frequency of the CNC filter may include adjusting a number of taps of the CNC filter.

A fourth implementation of such a method may also include determining, using the EMI detector circuitry operating in the digital domain, an amplitude associated with the EMI, where deriving, using the EMI cancelling circuitry operating in the digital domain, the correction signal may also include deriving the correction signal to have a gain based on the amplitude associated with the EMI, and adding, using the EMI cancelling circuitry operating in the analog domain, the correction signal to the incoming signal may also include adding the correction signal having the gain.

In a first aspect of that fourth implementation, the EMI cancelling circuitry may include at least one impedance element and an amplifier, and the method may also include configuring the delay length and the gain by respectively activating an element among the at least one impedance element and setting a gain of the amplifier based on the amplitude associated with the EMI.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
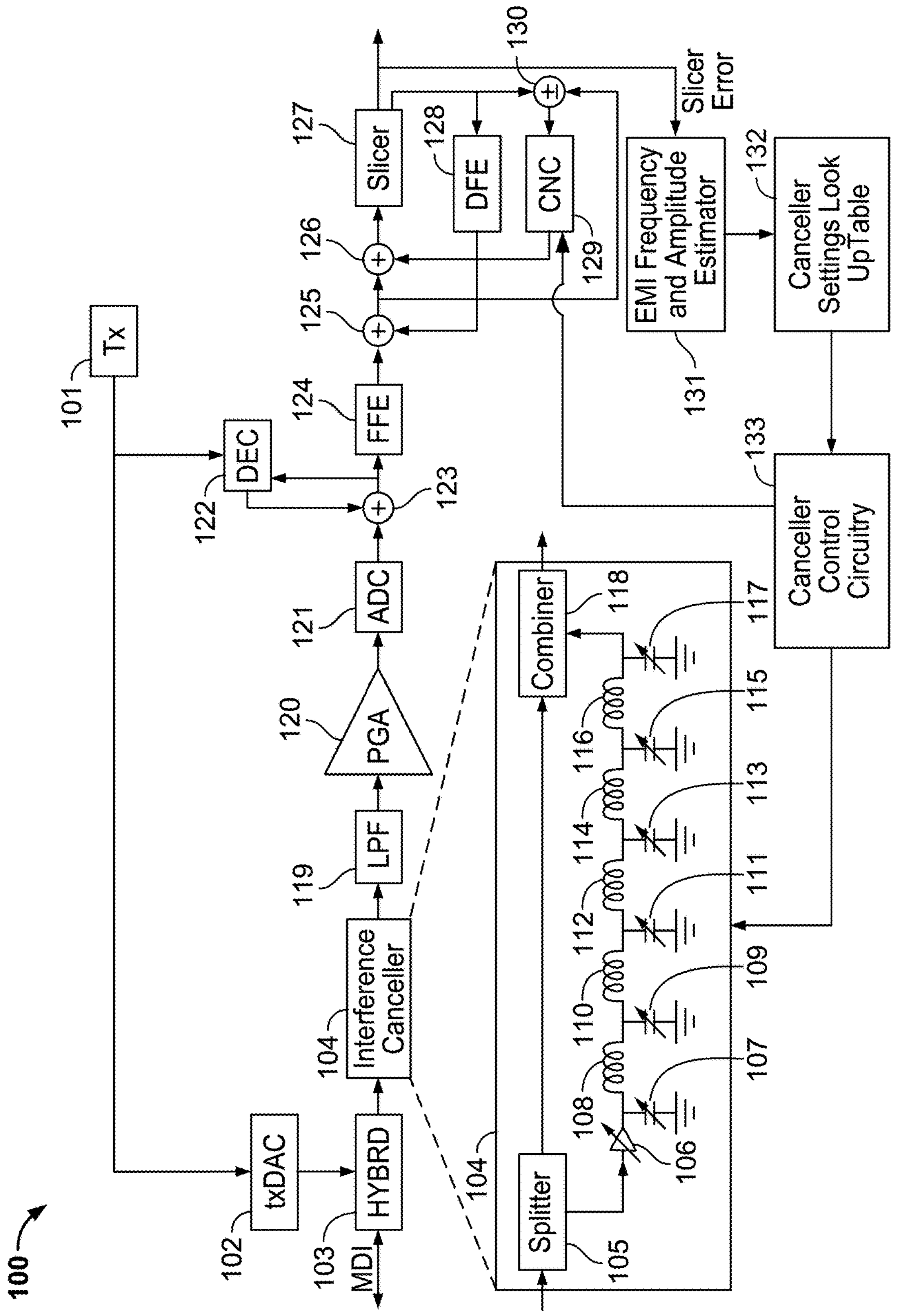
FIG. 1 is a block diagram of a physical layer transceiver with EMI cancellation, in accordance with implementations of the subject matter of this disclosure.

EMI is commonly encountered in electronic devices, and may prevent accurate transmission of data in digital systems. While the subject matter of this disclosure may have relevance in any kind of environment, the ability of a digital data network to function in the face of EMI is particularly significant in a vehicular environment, such as an automotive environment (but also in aircraft, ships or other vehicles), where timely and accurate response to operator inputs may be important, especially in applications where signaling errors can impact driving functionality and/or safety. Data networks such as automotive networks may transmit signals in both the digital and analog domains, and EMI may occur in either domain. Vehicular networks (e.g., automotive, aviation, or marine networks) may be subject to particularly high levels of EMI (e.g., where the power of the EMI may approach or in some cases surpass the power of the signal of interest) resulting from being confined to a small volume, having a large number of electromagnetic signals propagating in the small volume, moving at high speeds, encountering rough road surfaces, and moving through propagating electromagnetic fields, or any combination thereof. The EMI may be attributed to one or more devices associated with a signal, one or more nearby devices, a medium through which a signal propagates, any other source of electronic interference, noise, or energy, or any combination thereof. As opposed to addressing the sources of the EMI, it may be more desirable to manipulate signals subjected to EMI to compensate for the EMI (e.g., by cancelling the EMI, correcting for the effects of the EMI, amplifying or clarifying the desired contents of the signal that is subject to EMI, or any combination thereof).

EMI may be of particular concern in electronically noisy environments. For example, automotive communication systems may encounter electronically noisy environments. If EMI is not compensated for, data links in systems such as automotive data networks may be broken, disrupted, or otherwise adversely affected. For example, a vehicle system that relies on an automotive data network that is affected by EMI may not receive, or may react too slowly to, driver inputs. Thus, systems and methods of compensating for EMI may be provided in automotive and other data networks.

In some typical systems, EMI is compensated for entirely in the digital domain. In some such systems, a physical layer transceiver may receive a signal that is subject to EMI, optionally convert the signal subject to EMI to the digital domain, and then compensate for the EMI using for instance digital signal processing (DSP) techniques. For example, an adaptive colored noise canceller (CNC) filter may operate on the digital signal (e.g., by adapting to a desired frequency and gain associated with the digital signal) to reduce or filter out the EMI. The adapted CNC may adequately compensate for relatively low levels of EMI, but it may be ineffective at compensating for higher levels of EMI.

In accordance with implementations of the subject matter of the present disclosure, a physical layer transceiver includes EMI detector circuitry and EMI cancelling circuitry to, in the analog domain, cancel or compensate for EMI detected in the digital domain. The physical layer transceiver receives an input signal (e.g., a driver input or a signal from a vehicle transducer) that is subject to EMI and processes the signal in the analog domain before propagating the signal through the automotive network in the digital domain.

When the received signal is in the digital domain, EMI detector circuitry of the transceiver is configured to determine at least one property of the EMI. For example, the at least one property may be a primary frequency associated with the EMI, an amplitude associated with the EMI, a harmonic frequency associated with the EMI, any other property of the EMI, or any combination thereof.

Based on the at least one property of the EMI, EMI cancelling circuitry of the transceiver is configured to derive a correction signal. The derivation of the correction signal may be generated in the digital domain, in the analog domain, or in both domains. The EMI cancelling circuitry is also configured to add, in the analog domain, the correction signal to the received signal to reduce the EMI in a digital signal corresponding to the received signal. The correction signal may reduce the EMI by having a particular delay length that is based on the primary frequency of the EMI and therefore destructively interferes with the EMI upon being added to the received signal. In some implementations, the correction signal may better reduce the EMI by also having a specific gain that is based on the amplitude associated with the EMI (e.g., where the specific gain matches an amplitude of the correction signal to the amplitude associated with the EMI).

In some implementations, the EMI cancelling circuitry generates the correction signal by activating (e.g., coupling to the correction signal and/or setting a variable impedance to a specific value) at least one impedance element (e.g., at least one capacitor, inductor, resistor or other suitable analog circuit element). The at least one impedance element may be used to configure the delay length, gain, or other property of the correction signal. In some implementations, the EMI cancelling circuitry may access a look-up table (e.g., of the physical layer transceiver) or other database indicating which one or more impedance elements to activate based on the primary frequency and/or another property of the EMI.

In some implementations, additional circuitry is used to further compensate for the EMI. For example, after the EMI has been cancelled by the EMI cancelling circuitry in the analog domain, a colored noise canceller (CNC) filter may be used to process and further reduce residual EMI of the signal by filtering the signal in the digital domain. The CNC filter may be adaptable, such that a filtering property of the CNC filter may be adapted based on the primary frequency and/or another property of the EMI. The CNC filter may be coupled to controller circuitry that is configured to adapt the CNC filter (e.g., based on data or instructions of a look-up table, where the data or instructions correspond to at least one property of the EMI).

In some implementations, additional circuitry is used to condition the EMI for detection by the EMI detector circuitry. For example, before the EMI has been cancelled but after the incoming analog signal has been converted to a digital signal, slicer circuitry may be used to process a slicer error from the digital signal. The EMI detector circuitry may be configured to use this slicer error to determine the primary frequency, amplitude, and/or other properties of the EMI.

An illustrative and non-limiting example of an implementation of the present disclosure is as follows. A vehicle equipped with an automotive Ethernet network, including at least one physical layer transceiver, is being driven. Through one of its physical layer transceivers, the vehicle receives an incoming communication signal from a sensor of the vehicle, or a remote transmitter or transceiver, and the signal is subject to EMI. After receiving the incoming signal, the physical layer transceiver conditions the signal (e.g., with any number of suitable receive path circuitry operations) and then performs an analog-to-digital (ADC) conversion. The resulting digital signal is further conditioned and is then processed by slicer circuitry, which derives a slicer error from the digital signal. If there is any EMI in the signal, the EMI detector circuitry is configured to estimate, from the slicer error, or other suitable digital processing, the primary frequency of the EMI to which the digital signal is subjected. Other properties of the EMI may also be estimated and used for EMI cancellation, as explained above and as further explained below.

Continuing this illustrative example, the EMI detector circuitry provides the primary frequency of the EMI to EMI cancelling circuitry. To derive a corresponding correction signal, the EMI cancelling circuitry accesses a look-up table including data that corresponds to instructions for operating control circuitry of the EMI cancelling circuitry, performs a computation that provides instructions to the operating control circuitry of the EMI cancelling circuitry, or otherwise determines a manner for cancelling the EMI. The instructions indicate specific impedance elements to activate based on the primary frequency of the EMI such that a correction signal is generated and the EMI is at least partially cancelled. Specifically, the control circuitry of the EMI cancelling circuitry may activate a specific combination of inductors and capacitors to generate the correction signal, which includes a delay that corresponds to the primary frequency of the EMI. Interference canceller circuitry of the EMI cancelling circuitry adds the correction signal to the incoming communication signal, and the delay generates interference that is destructive to the EMI of the incoming signal. In some implementations, the control circuitry of the EMI cancelling circuitry also adapts a CNC filter based on the primary frequency of the EMI. The adapted CNC filter further reduces residual EMI that remains after the delay-based EMI cancellation of the correction signal.

In some implementations, the subject matter of this disclosure may be applied to data or communication networks outside of vehicular systems. For example, networks associated with homes, enterprises, and data centers may incorporate the subject matter of this disclosure to mitigate the EMI that may occur in those networks.

Figure 2:
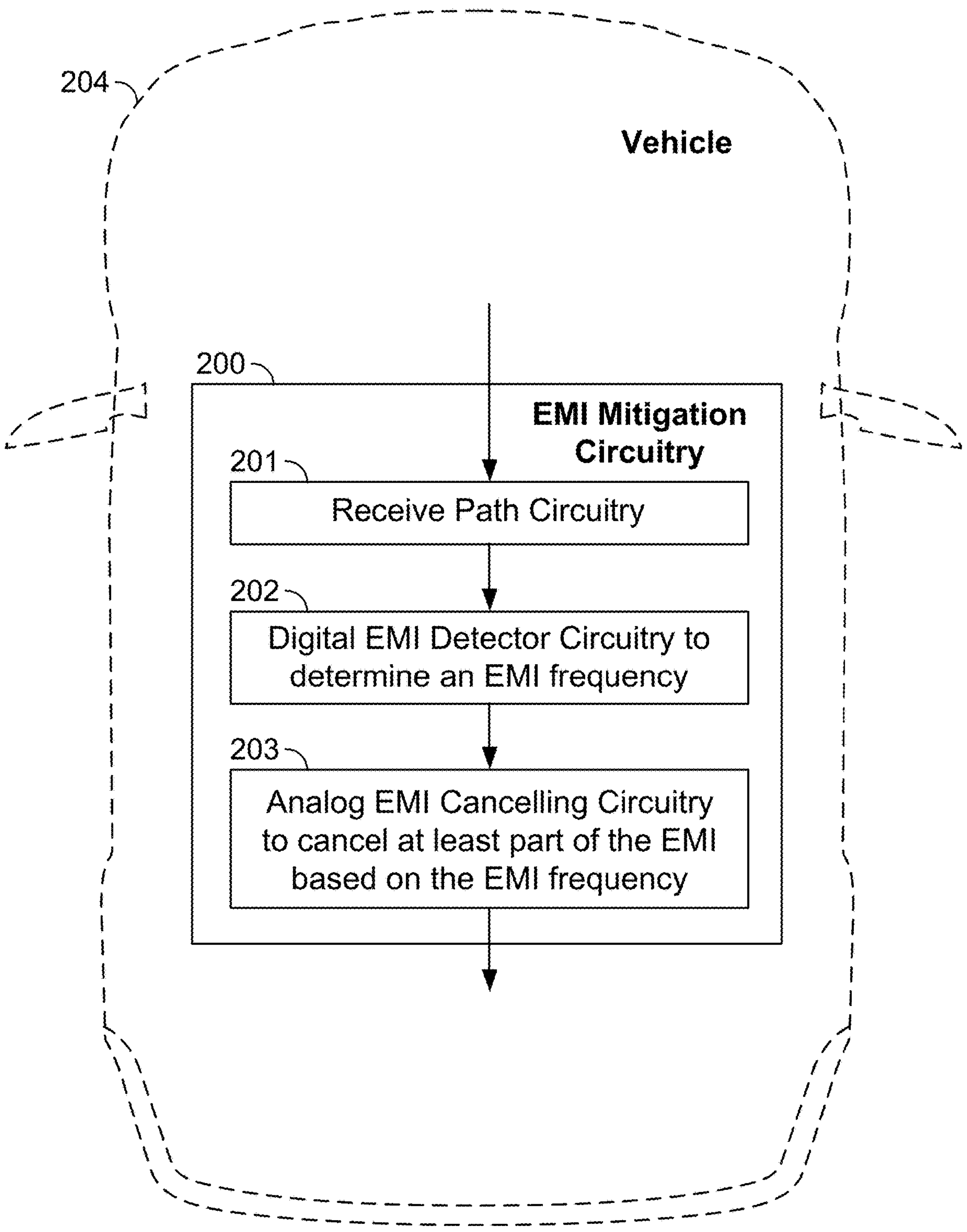
FIG. 2 is a block diagram of processing circuitry components, in accordance with implementations of the subject matter of this disclosure.
Figure 3:
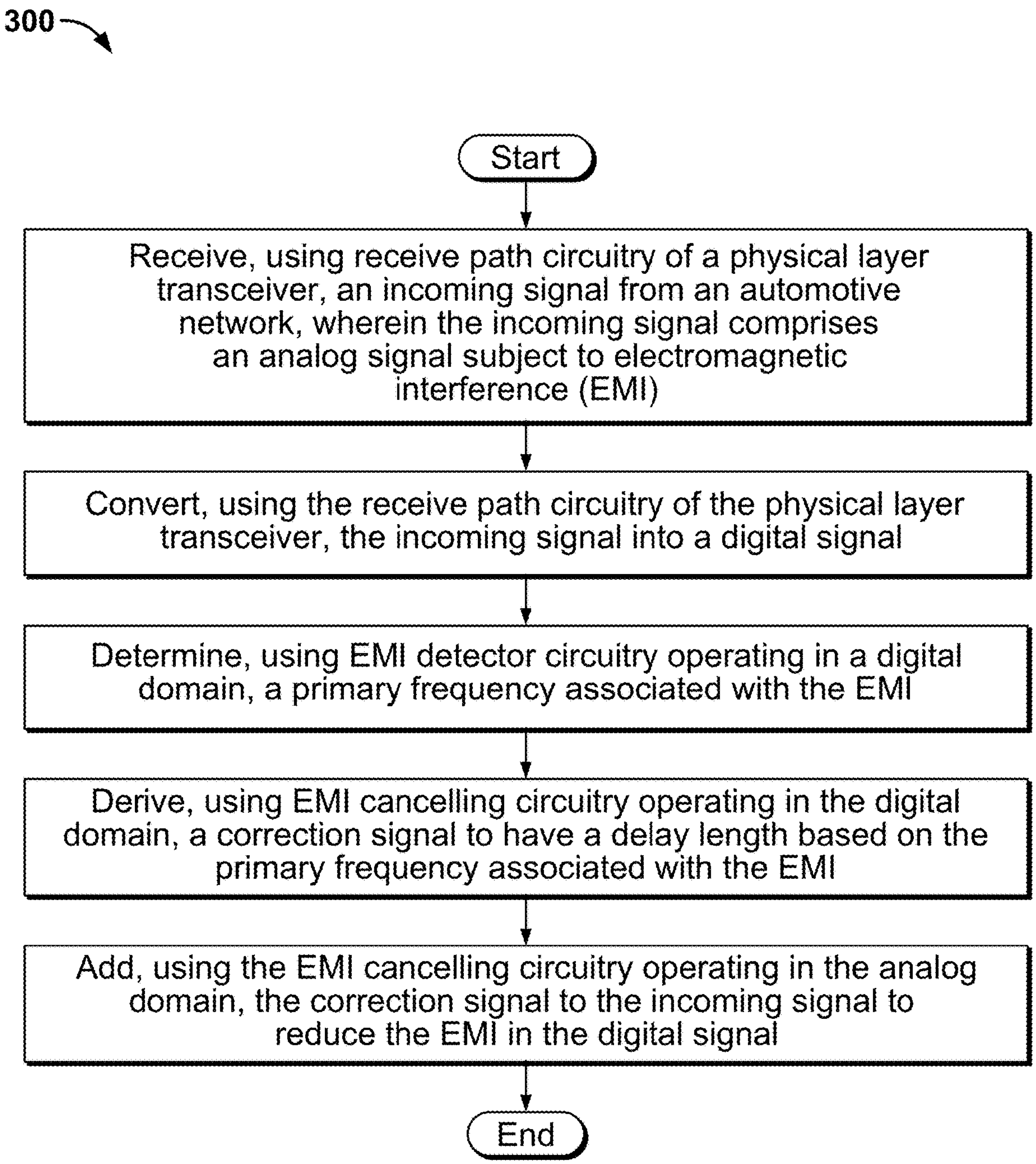
FIG. 3 is a flow diagram of a method for reducing EMI, in accordance with implementations of the subject matter of this disclosure.

The subject matter of this disclosure may be better understood by reference to FIGS. 1-3.

FIG. 1 is a block diagram 100 of a physical layer transceiver (PHY) for reducing the EMI that is associated with an incoming signal, in accordance with some implementations of the present disclosure. PHY 100 includes hybrid coupler 103, which receives data from a medium-dependent interface (MDI). The MDI connects to a network medium (e.g., of an automotive Ethernet network, e.g., through a coaxial or other suitable network cable). A received signal from the MDI is conditioned (e.g., demultiplexed) by the hybrid coupler 103 and then processed by circuitry of PHY 100 operating in the analog and digital domains. PHY 100 also includes transmitter (Tx) 101, which is included for sending, onto the automotive network, data from the sensor, transducer, or actuator that the PHY 100 services.

The output of hybrid coupler 103 is coupled to interference canceller 104. Circuitry of interference canceller 104 is configured to add a correction signal that is generated to cancel out or reduce a magnitude, power, or impact of the EMI to which incoming signals are subjected (e.g., by destructively interfering with the EMI). As further explained below, interference canceller 104 derives and generates the correction signal (e.g., with a specific delay and/or gain) based on properties of the EMI (e.g., a primary frequency and/or amplitude). In some implementations, interference canceller 104 operates on a feedback loop, and upon initial receipt of an incoming signal, generating the correction signal may be bypassed until sufficient time has passed for processes of the feedback loop to be executed.

Interference canceller 104 includes a signal splitter 105, which, in an implementation, splits incoming signals into a first path that directly couples to combiner 118 and into a second path that couples to one or more impedance elements (e.g., impedance elements 107 to 117). The second path includes a variable gain amplifier (VGA) 106. In some implementations, the VGA 106 configures a gain of the correction signal such that the correction signal is appropriately scaled (e.g., with respect to the amplitude of the EMI) to cancel out the EMI. In some implementations, appropriately scaling the gain helps to retain desired information of the incoming signal while cancelling out the EMI to which the signal is subjected. Thus, the correction signal may destructively interfere with the EMI to which the incoming signal is subjected without affecting the desired information of the incoming signal.

Interference canceller 104 includes a plurality of impedance elements (e.g., inductors, capacitors, resistors, any other impedance element, or any combination thereof). In some implementations (e.g., as shown in FIG. 1), the plurality of impedance elements includes variable capacitors 107, 109, 111, 113, 115, and 117, and inductors 108, 110, 112, 114, and 116. By propagating at least a portion of the incoming signal through specifically configured impedance elements of the second path, a correction signal is generated to have a delay based on the primary frequency (or another suitable harmonic frequency or property) of the EMI to which the incoming signal is subjected.

In the illustrative implementation of FIG. 1, the plurality of inductors (e.g., with net inductance L) and capacitors (e.g., with net capacitance C) result in an L-C filter that delays signals passing through the second path of interference canceller 104. In some implementations, the amount of this delay is based at least on the capacitance of the L-C filter (e.g., as set by the capacitance values of variable capacitors 107, 109, 111, 113, 115, and 117). In some implementations, the amount of delay is based at least on the inductance of the L-C filter (e.g., as set by the inductance values of inductors 108, 110, 112, 114, and 116). In some implementations, the impedance elements include resistors (e.g., fixed or variable resistors with net resistance R, e.g., to result in an R-C filter), and the amount of delay may be based on values of the resistance and/or capacitance of the R-C filter. In some implementations, the impedance elements include resistors, capacitors, and inductors (e.g., any of the aforementioned types of these elements), and the amount of delay may be based on the values of the resistance, capacitance, and/or inductance values of the R-L-C filter.

As shown in FIG. 1, canceller control circuitry 133 couples to interference canceller 104. Canceller control circuitry 133 may control or activate the plurality of impedance elements (e.g., by setting a capacitance value of one or more variable capacitors 107, 109, 111, 113, 115, or 117, and/or by coupling or decoupling any of the one or more variable capacitors to the second signal path). During this control or activation, canceller control circuitry 133 may operate based on instructions from canceller settings look up table 132 (e.g., the canceller control circuitry 133 may derive properties of the correction signal from the look up table 132). For example, canceller settings look up table 132 may relate specific properties of the EMI to which an incoming signal is subjected (e.g., with these properties provided by EMI frequency and amplitude estimator 131) with corresponding configurations of the plurality of impedance elements, such that canceller control circuitry 133 may control and/or activate the plurality of impedance elements of interference canceller 104 to best cancel out the EMI.

At the end of the second path of interference canceller 104, combiner 118 combines the signal of the first path (e.g., at least a portion of the incoming signal) and the signal of the second path (e.g., the correction signal). The combiner adds the signals of the first and second paths such that the correction signal destructively interferes with (e.g., cancels out) the EMI to which the incoming signal is subjected, such that the incoming signal (or a derivative of this signal) exits combiner 118 with reduced EMI.

As mentioned, PHY 100 may operate upon receipt of an incoming signal and may initially bypass the EMI cancellation (e.g., by not activating impedance elements) of the interference canceller circuitry 104. After a sufficient number of clock cycles has been completed for propagating the incoming signal through PHY 100 and executing processes of the feedback loop coupled to interference canceller circuitry 104 (e.g., generating the Fast Fourier Transform or otherwise determining the primary EMI frequency, executing other possible operations of EMI frequency and amplitude estimator 131, and executing operations of canceller control circuitry 133), interference canceller circuitry 104 may activate impedance elements to cancel out EMI to which the incoming signal is subjected. Thereafter, an EMI-reduced incoming signal may be provided by the PHY to other functional circuitry (e.g., of an automotive data network or automotive control circuitry).

Additional circuitry of PHY 100 operates in coordination with interference canceller 104. A low-pass filter (LPF) 119 is coupled to the output of interference canceller 104 and a programmable gain amplifier (PGA) 120 is coupled to the output of the LPF. The LPF 119 and PGA 120 serve to at least condition the incoming signal and/or the EMI-reduced incoming signal for processing by analog-to-digital converter (ADC) 121.

A signal adder 123 is coupled to the output of ADC 121. The signal adder 123 adds a signal from digital error correction (DEC) 122 to the output of ADC 121. In some implementations, DEC 122 operates on the incoming signal (e.g., as directly received over the MDI) to provide a digital error-correction signal that is added to the digital signal provided by ADC 121 to correct errors in this digital signal. In some implementations, the output of signal adder 123 is coupled to DEC 122 to provide feedback information that may improve the ability of DEC 122 to digitally correct for errors in signals received over the MDI. The output of signal adder 123 is coupled to feed-forward equalizer (FFE) 124, which may serve to reduce distortion or otherwise condition the signal for subsequent processing.

A signal adder 125 is coupled to the output of FFE 124. This signal adder 125 also receives the output of decision feedback equalizer (DFE) 128. By adding the outputs of FFE 124 and DFE 128, signal adder 125 may condition the signal for subsequent processing (e.g., including error detection as described above and as further described below). The output of signal adder 125 is coupled to the input of signal adder 126 and the input of signal adder/subtractor 130. Signal adder 126 also receives the output of CNC filter 129 and adds this output to the output of signal adder 125.

The output of signal adder 126 is coupled to slicer 127. Circuitry of slicer 127 is configured to process a slicer error that is provided to EMI frequency and amplitude estimator 131, as shown in FIG. 1. The slicer error may contain information that is used to determine properties (e.g., including at least the primary frequency and/or the amplitude) of the EMI to which the incoming signal is subjected. As indicated by the arrow extending to the right of slicer 127 in FIG. 1, the slicer also provides an output (e.g., the incoming signal or the EMI-reduced incoming signal) to other functional circuitry (e.g., within an engine control unit (ECU), body control unit (BCU), other on-board computer, physical layer transceiver, or other electronic system of any suitable vehicle).

Slicer 127 additionally provides an output to DFE 128 and adder/subtractor 130. DFE 128 operates on the output of slicer 127 to condition signals arriving at adder 125 for subsequent processing. Adder/subtractor 130 combines the output of the slicer 127 with the output of signal adder 125 and provides this combined signal to CNC 129.

In some implementations, CNC 129 reduces residual EMI to which an EMI-reduced incoming signal is subjected. For example, after EMI has been cancelled by interference canceller 104, some residual EMI may remain (e.g., a residual portion of the EMI that was not completely cancelled, and/or EMI that was introduced downstream of the interference canceller) and CNC 129 may further reduce or cancel that residual EMI. CNC 129 may reduce or cancel that residual EMI by adding, at signal adder 126, an inverse sinusoid (e.g., a sinusoid that has the primary frequency of the EMI and a 180-degree phase shift) to the signal leaving signal adder 125. CNC 129 may be adaptable, such that properties of the CNC, including how it reduces the residual EMI, are adapted based on the properties of the EMI. For example, the center frequency of the CNC may be adapted based on the primary frequency of the EMI (e.g., to match the primary frequency of the EMI). In some implementations, as shown in FIG. 1, the canceller control circuitry 133 may couple to the CNC 129 to adapt the properties of the CNC based on properties of the EMI. In some implementations, the canceller control circuitry 133 may adapt the center frequency of CNC 129 by adjusting a number of taps or a filter coefficient of the CNC.

EMI frequency and amplitude estimator 131 receives the slicer error from slicer 127. Based on this slicer error, EMI frequency and amplitude estimator 131 determines properties of the EMI (e.g., the primary frequency, other harmonic frequencies, amplitude, or other suitable properties of the EMI). In some implementations, EMI frequency and amplitude estimator 131 otherwise or additionally determines properties of the EMI based on signals other than the slicer error (e.g., the output of ADC 121 or common mode sensing signals). In some implementations, EMI frequency and amplitude estimator 131 determines a primary frequency (as well as other frequencies of interest, e.g., harmonic frequencies) of the EMI by calculating a Fast Fourier Transform of the EMI signal and determining the primary peak (e.g., the peak having the greatest amplitude or full width at half maximum) in the corresponding Fourier spectrum. In some implementations, EMI frequency and amplitude estimator 131 determines a primary frequency (as well as other frequencies of interest, e.g., harmonic frequencies) of the EMI by using a matched filter or a Goertzel filter (e.g., where these filters may be tuned to analyze specific frequencies that are expected to be associated with the EMI). These properties of the EMI are at least coupled (e.g., by processing circuitry of PHY 100) to canceller settings look up table 132. Canceller settings look up table 132 includes data that corresponds to how interference canceller 104 cancels out EMI. For example, with consideration of possible EMI properties including various primary frequencies, amplitudes, harmonic frequencies, other suitable EMI properties, or any combination thereof, canceller settings look up table 132 may store impedance values (e.g., where the impedance values correspond to inductances, capacitances, and/or resistances) for generating a suitable delay and/or other desired property of the correction signal. In some implementations, canceller settings look up table 132 may include capacitance values of one or more variable capacitors 107, 109, 111, 113, 115, and 117.

In some implementations, properties of the residual EMI (e.g., the EMI that remains after applying the correction signal at interference canceller 104) are known. For example, known properties of interference canceller 104 may determine how the correction signal reduces the initial EMI and may thus determine corresponding properties of the residual EMI. Based on these known properties of the residual EMI, properties of CNC 129 (e.g., the center frequency, number of taps, or filter coefficient of CNC 129, properties of a matched filter or Goertzel filter within CNC 129, or other suitable properties of CNC 129) may be adjusted to best mitigate the residual EMI. For example, pre-determined properties of CNC 129 may be applied based on the known properties of the residual EMI.

Canceller settings look up table 132 is coupled to canceller control circuitry 133 such that the canceller control circuitry may derive a correction signal and correspondingly control aspects (e.g., properties of the plurality of impedance elements and/or a gain of VGA 106) of the interference canceller 104. In some implementations, the canceller control circuitry 133 may activate (e.g., reduce from a very large capacitance, increase from a very small capacitance, or otherwise tune to a specific capacitance) the one or more variable capacitors 107, 109, 111, 113, 115, and 117. In some implementations, activating these one or more variable capacitors may include setting specific capacitance values for each of the capacitors as retrieved from canceller settings look up table 132.

FIG. 2 shows a block diagram of principal circuitry blocks for EMI mitigation in an automotive network, in accordance with implementations of the subject matter of the present disclosure. EMI mitigation circuitry 200 of the system includes receive path circuitry 201, EMI detector circuitry 202, and EMI cancelling circuitry 203. In some implementations, EMI mitigation circuitry 200 is included within vehicle 204 (e.g., within an engine control unit (ECU), body control unit (BCU), other on-board computer, physical layer transceiver, or other electronic system of any suitable vehicle). In some implementations, EMI mitigation circuitry 200 may correspond to PHY 100. In some implementations, vehicle 204 may correspond to an automobile, van, truck, bus, train, airplane, boat, motorcycle, electric mobility device, or any other vehicle.

As shown in FIG. 2, a signal flows into EMI mitigation circuitry 200 from a remote source (e.g., other circuitry of vehicle 204) and is sequentially processed by receive path circuitry 201, EMI detector circuitry 202, and EMI cancelling circuitry 203. The output of EMI cancelling circuitry 203 is coupled to functional circuitry (e.g., of vehicle 204) that is outside of EMI mitigation circuitry 200.

In some implementations, receive path circuitry 201 includes LPF 119, PGA 120, ADC 121, DEC 122, signal adders 123, 125, and 126, FFE 124, slicer 127, and DFE 128. In some implementations, EMI detector circuitry 202 includes EMI frequency and amplitude estimator 131. In some implementations, EMI cancelling circuitry 203 includes interference canceller 104 (and all the elements thereof), CNC 129, canceller settings look up table 132, canceller control circuitry 133, and adder/subtractor 130.

A method according to implementations of the subject matter of this disclosure, for cancelling EMI from a signal (e.g., where the signal is received by a physical layer transceiver of an automotive network) is diagrammed in FIG. 3. In some implementations, method 300 is executed by PHY 100 or EMI mitigation circuitry 200. At 301, processing circuitry receives, using receive path circuitry (e.g., receive path circuitry 201) of a physical layer transceiver (e.g., PHY 100), an incoming signal from an automotive network, wherein the incoming signal includes an analog signal subject to electromagnetic interference. At 302, processing circuitry converts, using the receive path circuitry (e.g., ADC 123) of the physical layer transceiver, the incoming signal into a digital signal. At 303, processing circuitry determines, using EMI detector circuitry (e.g., EMI frequency and amplitude estimator 131) operating in a digital domain, a primary frequency associated with the EMI. At 304, processing circuitry derives, using EMI cancelling circuitry (e.g., canceller settings look up table 132 and canceller control circuitry 133) operating in the digital domain, a correction signal to have a delay length based on the primary frequency associated with the EMI. At 305, processing circuitry adds, using the EMI cancelling circuitry (e.g., interference canceller 104) operating in the analog domain, the correction signal to the incoming signal to reduce the EMI in the digital signal.

In some implementations, method 300 also includes reducing residual EMI in the digital signal using a CNC filter (e.g., CNC 129).

In some implementations, determining a primary frequency associated with the EMI also includes determining other properties associated with the EMI (e.g., an amplitude, one or more harmonic frequency, or any other suitable property of the EMI).

In some implementations, deriving a correction signal also includes the correction signal having a gain based on the amplitude associated with the EMI. In some implementations, deriving a correction signal includes deriving a configuration (e.g., respective capacitance values) of impedance elements (e.g., inductors and variable capacitors) and activating the impedance elements according to the configuration to generate the delay length.

In some implementations, adding the correction signal to the communication signal includes combining (e.g., using combiner 118) two split signals (e.g., that were split by splitter 105), where the two split signals include at least a portion of a signal received at the hybrid coupler 103 (or a signal that is derived from such a received signal) and the correction signal. In some implementations, adding the correction signal reduces the EMI in the digital signal based on destructive interference that cancels out or destroys at least a portion of the EMI power at combiner 118. In some implementations, adding the correction signal includes activating a plurality of impedance elements (e.g., inductors and capacitors), where activating the plurality of impedance elements may include applying specific inductance and capacitance values (e.g., based on setting values of variable capacitors and/or coupling or decoupling of inductors).

Thus it is seen that an apparatus including circuitry for cancelling out EMI, and a method for operating the EMI-cancelling circuitry, has been provided.

It is noted that the foregoing is only illustrative of the principles of the invention, and that the invention can be practiced by other than the described implementations, which are presented for purposes of illustration and not of limitation, and the present invention is limited only by the claims which follow.

What is claimed is:

1. A physical layer transceiver for a vehicular network, the physical layer transceiver comprising:
- receive path circuitry configured to:
  - in an analog domain, receive an incoming signal from the vehicular network, wherein the incoming signal comprises an analog signal subject to electromagnetic interference (EMI), and
  - convert the incoming signal into a digital signal;
- EMI detector circuitry configured to, in a digital domain, determine a primary frequency associated with the EMI;
- EMI cancelling circuitry configured to:
  - derive, in the digital domain, a correction signal having a delay length based on the primary frequency determined in the digital domain and associated with the EMI, and
  - add, in the analog domain, the correction signal derived in the digital domain to the incoming signal to reduce the EMI in the digital signal; and
- a colored noise canceller (CNC) filter configured to, in the digital domain, after adding the correction signal to the incoming signal, further reduce the EMI in the digital signal by adding a second correction signal to the incoming signal, wherein the second correction signal comprises an inverse sinusoid of the EMI.

2. The physical layer transceiver of claim 1, further comprising controller circuitry configured to adapt a center frequency of the CNC filter based on the primary frequency associated with the EMI, wherein the inverse sinusoid of the EMI is based on the center frequency.

3. The physical layer transceiver of claim 2, wherein the controller circuitry is configured to adapt the center frequency of the CNC filter by adjusting a number of taps of the CNC filter.

4. A physical layer transceiver for a vehicular network, the physical layer transceiver comprising:
- receive path circuitry configured to:
  - in an analog domain, receive an incoming signal from the vehicular network, wherein the incoming signal comprises an analog signal subject to electromagnetic interference (EMI), and
  - convert the incoming signal into a digital signal;
- EMI detector circuitry configured to, in a digital domain, determine a primary frequency associated with the EMI; and
- EMI cancelling circuitry configured to:
  - derive, in the digital domain, a correction signal having a delay length based on the primary frequency determined in the digital domain and associated with the EMI, and
  - add, in the analog domain, the correction signal derived in the digital domain to the incoming signal to reduce the EMI in the digital signal,
- wherein:
- the EMI detector circuitry is further configured to determine an amplitude associated with the EMI;

the EMI cancelling circuitry is further configured to set a gain of the correction signal, wherein the gain is based on the amplitude associated with the EMI; and wherein the EMI cancelling circuitry comprises at least one impedance element and an amplifier, wherein the delay length and the gain are respectively configured by activating an element among the at least one impedance element and by setting a gain of the amplifier based on the amplitude associated with the EMI.

5. A method for reducing, from signals received over a physical layer transceiver in a vehicular network, electromagnetic interference (EMI), the method comprising:

receiving, using receive path circuitry of the physical layer transceiver operating in an analog domain, an incoming signal from the vehicular network, wherein the incoming signal comprises an analog signal subject to EMI;

converting, using the receive path circuitry of the physical layer transceiver, the incoming signal into a digital signal;

determining, using EMI detector circuitry operating in a digital domain, a primary frequency associated with the EMI;

deriving, using EMI cancelling circuitry operating in the digital domain, a correction signal to have a delay length based on the primary frequency determined in the digital domain and associated with the EMI;

adding, using the EMI cancelling circuitry operating in the analog domain, the correction signal derived in the digital domain to the incoming signal to reduce the EMI in the digital signal; and after adding the correction signal to the incoming signal, further reducing, using a colored noise canceller (CNC) filter operating in the digital domain, the EMI in the digital signal by adding a second correction signal to the incoming signal, the second correction signal comprising an inverse sinusoid of the EMI.

6. The method of claim 5, further comprising adapting, using controller circuitry, a center frequency of the CNC filter based on the primary frequency associated with the EMI, wherein the inverse sinusoid of the EMI is based on the center frequency.

7. The method of claim 6, wherein adapting, using controller circuitry, the center frequency of the CNC filter comprises adjusting a number of taps of the CNC filter.

8. A method for reducing, from signals received over a physical layer transceiver in a vehicular network, electromagnetic interference (EMI), the method comprising:

receiving, using receive path circuitry of the physical layer transceiver operating in an analog domain, an incoming signal from the vehicular network, wherein the incoming signal comprises an analog signal subject to EMI;

converting, using the receive path circuitry of the physical layer transceiver, the incoming signal into a digital signal;

determining, using EMI detector circuitry operating in a digital domain, a primary frequency associated with the EMI;

deriving, using EMI cancelling circuitry operating in the digital domain, a correction signal to have a delay length based on the primary frequency determined in the digital domain and associated with the EMI;

adding, using the EMI cancelling circuitry operating in the analog domain, the correction signal derived in the digital domain to the incoming signal to reduce the EMI in the digital signal;

determining, using the EMI detector circuitry operating in the digital domain, an amplitude associated with the EMI; wherein:

deriving, using the EMI cancelling circuitry operating in the digital domain, the correction signal further 10 comprises deriving the correction signal to have a gain based on the amplitude associated with the EMI; and adding, using the EMI cancelling circuitry operating in the analog domain, the correction signal to the incoming signal further comprises adding the correction signal having the gain; and wherein the EMI cancelling circuitry comprises at least one impedance element and an amplifier, the method further comprising configuring the delay length and the gain by respectively activating an element among the at least one impedance element and setting a gain of the amplifier based on the amplitude associated with the EMI.

* * * * *